United States Patent
Chang (10) Patent No.: US 7,110,228 B2
(45) Date of Patent: Sep. 19, 2006

(54) SEPARATED POWER ESD PROTECTION CIRCUIT AND INTEGRATED CIRCUIT THEREOF

(75) Inventor: Chyh-Yih Chang, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 10/711,568

(22) Filed: Sep. 24, 2004

(65) Prior Publication Data

US 2005/0286186 A1    Dec. 29, 2005

(30) Foreign Application Priority Data

Jun. 23, 2004    (TW) ............................... 93118054 A (51) Int. Cl.
*H02H 9/00*    (2006.01)
(52) U.S. Cl. ...................................................... 361/56
(58) Field of Classification Search ................... 361/56
See application file for complete search history.

(56) References Cited

U.S. PATENT DOCUMENTS

| 6,075,686 A | 6/2000 | Ker ............................... 361/56 |
| 6,208,126 B1* | 3/2001 | Gonthier ...................... 323/324 |
| 6,618,230 B1* | 9/2003 | Liu et al. ....................... 361/56 |

* cited by examiner

*Primary Examiner*—Brian Sircus
*Assistant Examiner*—Lucy Thomas
(74) *Attorney, Agent, or Firm*—Jianq Chyun IP Office (57) ABSTRACT

A separated power ESD protection circuit is disclosed. The separated power ESD protection circuit is coupled between a first and a second power lines. The separated power ESD protection circuit has a first diode, a second diode and a MOS transistor. The first diode has an anode and a cathode, wherein the anode is coupled to the first power line. The source of the MOS transistor is coupled to the second power line. The anode of the second diode is coupled to the second power line and cathode is coupled to the first power line. The first diode and the MOS transistor form a parasitic silicon-controlled rectifier (SCR) so as to provide a discharge route for ESD.

8 Claims, 8 Drawing Sheets

SEPARATED POWER ESD PROTECTION CIRCUIT AND INTEGRATED CIRCUIT THEREOF

CROSS-REFERENCE TO RELATED APPLICATION

This application claims the priority benefit of Taiwan application serial no. 93118054, filed Jun. 23, 2004.

BACKGROUND OF THE INVENTION

1. Field of the Invention

The present invention relates to an electro-static discharge (ESD) protection circuit, and more particularly to a separated power ESD protection circuit.

2. Description of Related Art

For the integrated circuit, the static charges due to touch of human bodies are often flowing into the internal circuit of the integrated circuit chip via the I/O pins. The static charges usually cause the high voltage pulse and this instant high voltage pulse would cause the damage to the integrated circuit. In order to prevent the integrated circuit from damage due to high voltage electrostatic pulse, electro-static discharge (ESD) protection circuits are disposed between the input pads and the internal circuit, so as to provide a discharge route for ESD, leading ESD currents to the power line.

Figure 1:
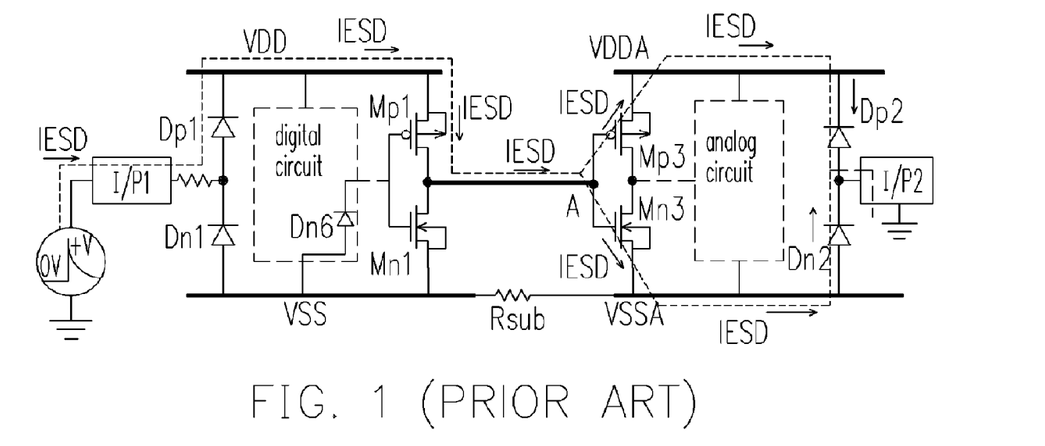
FIG. 1 is a schematic drawing showing a prior art ESD protection circuit.

For a mixed-mode signal integrated circuit, which comprises analog circuits and digital circuits, the power lines respectively used by the analog circuits and the digital circuits are separate, so as to avoid noises. For this design of the separated power lines, noises generated on the power lines for the digital circuit due to fast transition of the states of the digital circuits are not transmitted to the power lines of the analog circuits. FIG. 1 is a schematic drawing showing a prior art ESD protection circuit. Referring to FIG. 1, when ESD event occurs in one I/O pin to another I/O pin or one power pin to another power pin, the ESD current does not only flow through the widest metal line in the integrated circuit. When it occurs on the interface circuit between the two separated power lines, the ESD current usually flows along the weakest route. The interface circuit may get damaged due to ESD. Accordingly, the design of the separated power lines in the bus undermines the robustness of the integrated circuit.

Figure 2:
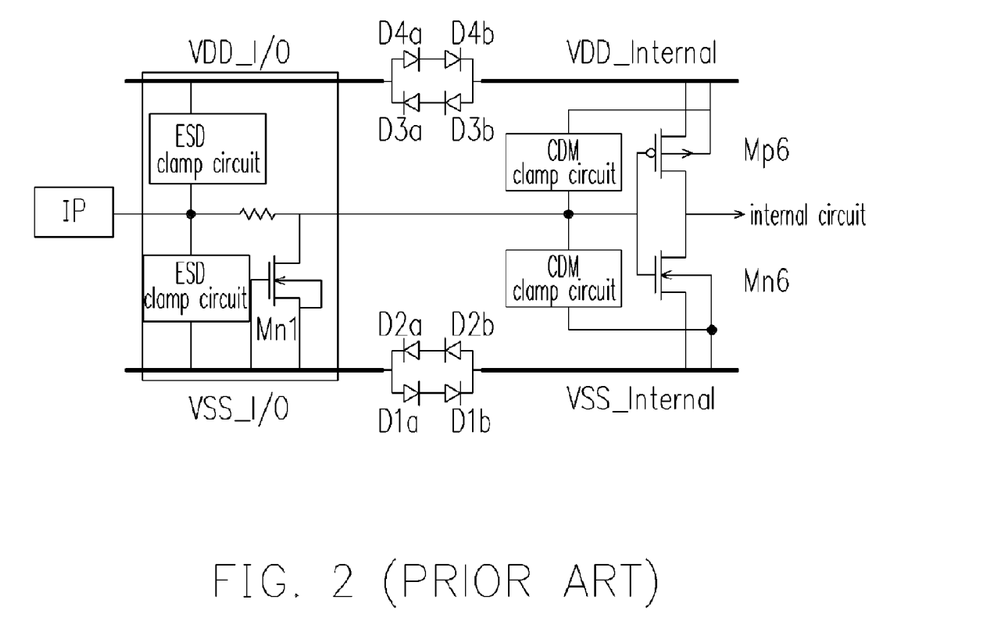
FIG. 2 is a schematic circuit showing a charged-device model (CDM) ESD protection circuit.

FIG. 2 is a schematic circuit showing a charged-device model (CDM) ESD protection circuit. The design of the circuit has the big problem on the separated power in integrated circuit either. In the ESD event on CDM protection circuit, static charges are stored in the bulk of the integrated circuit from the beginning. Then the static charges are discharged to the pad, which is grounded. This prior art CDM ESD protection circuit provides two routes. One route is through the CDM clamp circuit; the other is through the bi-direction diode string between the power lines VDD_I/O and VDD_Internal, and between VSS_I/O and VSS_Internal. If there is no the bi-direction diode string, under a high ESD current, some CMD current would damage the gate oxide layer in input.

Figure 3:
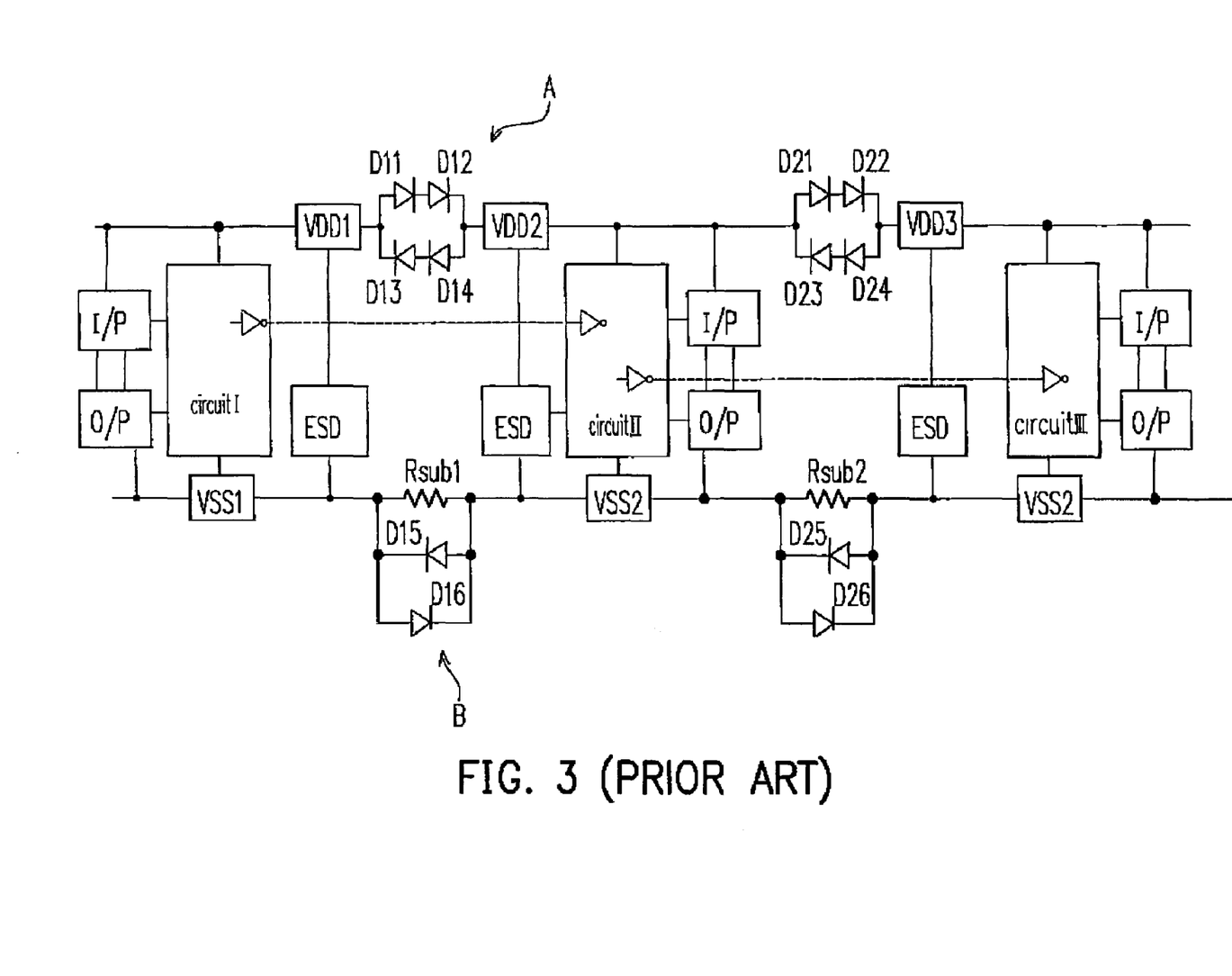
FIG. 3 is a schematic drawing showing an ESD protection circuit disclosed in U.S. Pat. No. 6,075,686.
Figure 4:
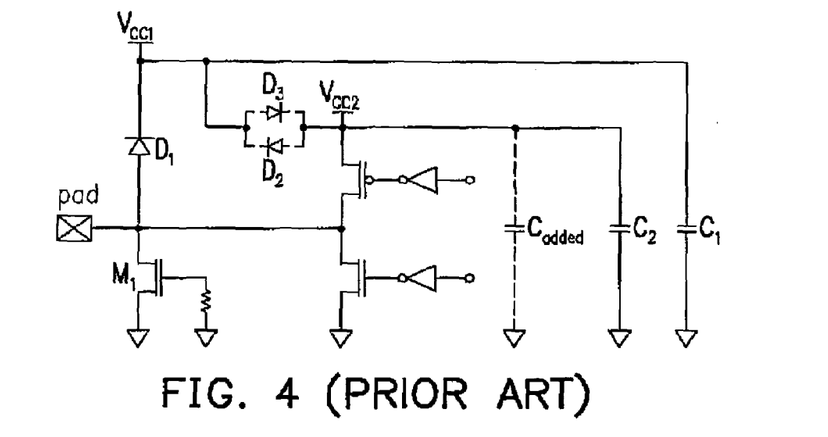
FIG. 4 is a schematic drawing showing an ESD protection circuit disclosed in U.S. Pat. No. 6,040,968.

FIG. 3 is a schematic view showing an ESD protection circuit disclosed in U.S. Pat. No. 6,075,686. The circuit comprises two diode strings with diodes coupled in opposite direction and in parallel, between the first power line and the second power line. In addition, FIG. 4 is a schematic drawing showing an ESD protection circuit disclosed in U.S. Pat. No. 6,040,968. Two diodes connected in parallel with opposite direction are disposed between the first and the second power lines. The application of these diodes, however, does not efficiently protect the circuit from ESD.

SUMMARY OF THE INVENTION

Accordingly, the present invention is directed to a separated power electro-static discharge (ESD) protection circuit, which has effective ESD protection between the separated power lines with the same electric polarity in a mixed-mode integrated circuit.

The present invention is also directed to an integrated circuit, which has effective ESD protection between the separated power lines with different electric polarity in a mixed-mode integrated circuit.

According to an embodiment of the present invention, the separated power electro-static discharge (ESD) protection circuit is coupled between a first power line and a second power line. The separated power ESD protection circuit comprises a first diode, a first metal-oxide-semiconductor (MOS) transistor and a second diode. The first diode has an anode and a cathode, wherein the anode is coupled to the first power line. The first metal-oxide-semiconductor (MOS) transistor has a gate, a source and a drain, wherein the drain is coupled to the cathode of the first diode and the source is coupled to the second power line. The second diode has an anode and a cathode, wherein the anode is coupled to the second power line and the cathode is coupled to the first power line. The first diode and the first MOS transistor constitute a parasitic silicon-controlled rectifier (SCR) for providing a static discharge route.

According to an embodiment of the present invention, the separated power ESD protection circuit further comprises a second MOS transistor. The second MOS transistor has a gate, a source and a drain, wherein the drain is coupled to the cathode of the second diode and the source is coupled to the first power line. The second diode and the second MOS transistor constitute a parasitic SCR. Accordingly, a discharge route with a SCR is bi-directional, either from the first power line to the second power line or from the second power line to the first power line.

According to an embodiment of the present invention, the first MOS transistor can be an N-type or a P-type MOS transistor. In another embodiment, the first and the second MOS transistors can be an N-type or a P-type MOS transistor.

The present invention discloses a separated power electro-static discharge (ESD) protection circuit coupled between a first power line and a second power line. The separated power ESD protection circuit comprises multiple first series diodes, a MOS transistor and multiple second series diodes. Each of the first series diodes has an anode and a cathode. The first series diodes are coupled to each other, wherein an anode of a first diode of the first series diodes is coupled to a first power line. The MOS transistor has a gate, a source and a drain, wherein the drain is coupled to a cathode of a last diode of the first series diodes and the source is coupled to a second power line. Each of the second series diodes has an anode and a cathode. The second series diodes is coupled to each other, wherein an anode of a first diode of the second series diodes is coupled to the second power line, and an cathode of a last diode of the second series diodes is coupled to the first power line. The first diode of the first series diodes and the first MOS transistor constitute a parasitic silicon-controlled rectifier (SCR) for providing a static discharge route.

According to an embodiment of the present invention, the separated power ESD protection circuit further comprises a second MOS transistor. The second MOS transistor has a gate, a source and a drain, wherein the drain is coupled to the cathode of the second series diodes, and the source is coupled to the first power line. The last diode of the second series diodes and the second MOS transistor constitute a parasitic SCR for providing an ESD route. Accordingly, the ESD route with a SCR is bi-directional, either from the first power line to the second power line or from the second power line to the first power line.

According to an embodiment of the present invention, the first MOS transistor can be an N-type or a P-type MOS transistor. In another embodiment, the first and the second MOS transistors can be an N-type or a P-type MOS transistor.

The present invention discloses an integrated circuit, which is adapted to protect a first internal circuit and a second internal circuit from electro-static discharge (ESD). The first internal circuit is coupled between a first high power line and a first low power line; the second internal circuit is coupled between a second high power line and a second low power line. The first and the second high power lines are separated from each other; the first and second low power lines are separated from each other. A voltage difference exists between the first and second high power lines, and a voltage difference exists between the first and second low power lines as well. The integrated circuit comprises a first ESD protection circuit, a second ESD protection circuit, a third ESD protection circuit and a fourth ESD protection circuit. The first ESD protection circuit is coupled between the first high and first low power lines. The second ESD protection circuit is coupled between the second high and second low power lines. The third ESD protection circuit is coupled between the first high and the second high power lines, selectively the first power line or the second high power line may be grounded while ESD occurs on the first high power line or the second high power line. The third ESD protection circuit comprises a first diode string, a first metal-oxide-semiconductor (MOS) transistor and a second diode string. The first diode string and the first MOS transistor are coupled in series. The second diode string is in parallel and reverse direction to the first diode string and the first MOS transistor. The first diode string and the first MOS transistor constitute a parasitic silicon-controlled rectifier (SCR) for providing an ESD route while triggered by ESD. The fourth ESD protection circuit is coupled between the first low and the second low power lines, selectively the first low power line or the second low power line is grounded while ESD occurring on the first low power line or the second low power line. The fourth ESD protection circuit comprises a third diode string, a second metal-oxide-semiconductor (MOS) transistor and a fourth diode string. The third diode string and the second MOS transistor are coupled in series. The fourth diode string is in parallel and in reverse direction to the third diode string and the second MOS transistor. The third diode string and the second MOS transistor, after being triggered due to the ESD phenomenon, constitute a parasitic silicon-controlled rectifier (SCR) for providing a discharge route while being triggered by ESD.

According to an embodiment of the present invention, the first MOS transistor of the integrated circuit can be an N-type or a P-type MOS transistor and the second MOS transistor of the integrated circuit can be an N-type or a P-type MOS transistor.

According to an embodiment of the present invention, the first diode string and the second diode string of the third ESD protection circuit of the integrated circuit comprise at least one diode. The third diode string and the fourth diode string of the fourth ESD protection circuit comprise at least one diode. In accordance with an embodiment of the present invention, the number of the first and second diode string depends on a voltage difference between the first high power line and the second high power line. The number of the third and fourth diode string depends on a voltage difference between the first low power line and the second low power line.

According to an embodiment of the present invention, the third ESD protection circuit further comprises a third MOS transistor, which is coupled to the second diode string in series. The first and third MOS transistors are coupled to the second high and the first high power lines, respectively. The fourth ESD protection circuit further comprises a fourth MOS transistor, which is coupled to the fourth diode string in series. The second and fourth MOS transistors are coupled to the second and the first low power lines, respectively.

According to an embodiment of the present invention, the first, second, third and fourth MOS transistors can be an N-type or a P-type MOS transistor.

According to an embodiment of the present invention, the integrated circuit further comprises a first input ESD protection circuit and a second input ESD protection circuit. The first input ESD protection circuit is coupled and among the first internal circuit, an input pad of the first internal circuit, the first high power line and the first low power line. The second input ESD protection circuit is coupled and among the second internal circuit, an input pad of the second internal circuit, the second high power line and the second low power line.

In order to make the aforementioned and other objects, features and advantages of the present invention understandable, a preferred embodiment accompanied with figures is described in detail below.

DESCRIPTION OF EMBODIMENTS

Figure 5:
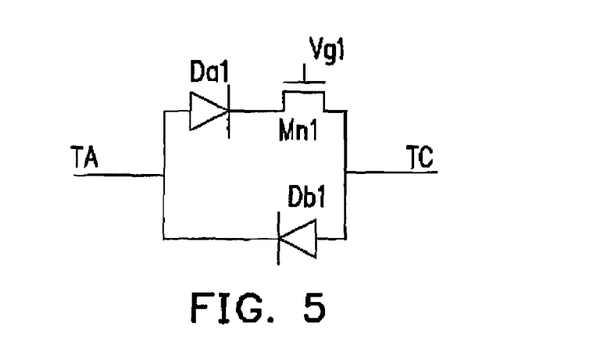
FIG. 5 is a schematic circuit drawing showing a separated power electro-static discharge (ESD) protection circuit according to the present invention.

FIG. 5 is a schematic circuit drawing showing a separated power electro-static discharge (ESD) protection circuit according to the present invention. Referring to FIG. 5, the separated power ESD protection circuit comprises two diodes Da1 and Db1 and an N-type metal-oxide-semiconductor (NMOS) transistor Mn1. The anode of the diode Da1 is coupled to the terminal TA, and the cathode is coupled to the drain of the NMOS transistor Mn1. The source of the NMOS transistor Mn1 is coupled to the terminal TC. The diode Db1 is coupled in parallel and reverse direction to the diode Da1 and the NMOS transistor Mn1. The anode of the diode Db1 is coupled to the terminal TC; the cathode is coupled to the terminal TA and the anode of the diode Da1. The terminals TA and TC are coupled to the separated power lines, such as two high power lines or two low power lines.

Figure 6:
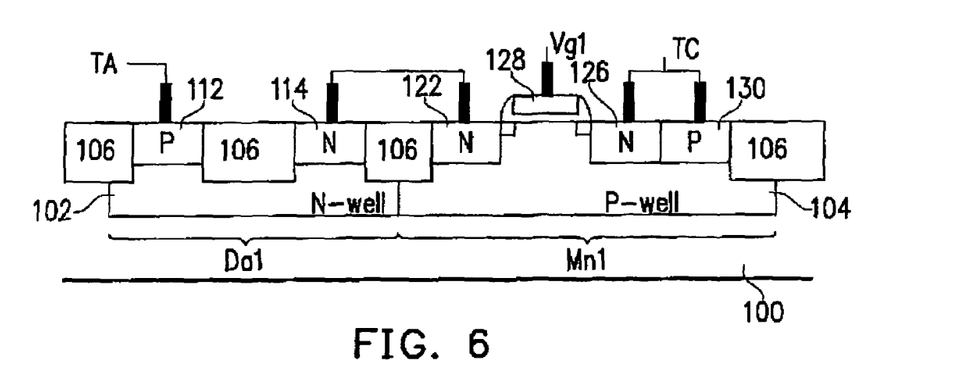
FIG. 6 is a partial schematic cross sectional drawing showing the separated power ESD protection circuit in FIG. 5.

FIG. 6 is a partial schematic cross sectional drawing showing the separated power ESD protection circuit in FIG. 5. In other words, FIG. 6 is a schematic physical structure drawing of the schematic circuit drawing shown in FIG. 5. Referring to FIG. 6, the cross sectional drawing shows the diode Da1 and the NMOS transistor Mn1. According to the drawing, one of ordinary skill in the art will understand how a cross sectional view of the diode Db1 looks like. Referring to FIG. 6, a substrate 100 is provided. The substrate 100 can be a P-type substrate. An N-well 102 and a P-well 104 are formed in the substrate 100. In the N-well 102, a P-type doped area 112 and an N-type doped area 114 representing the anode and the cathode of the diode Da1, respectively, are formed therein. They are separated by an isolation structure 106. The isolation structure 106 can be a field oxidation (FOD) structure or a shallow trench isolation (STI) structure. N-type doped areas 122 and 126 formed in the P-well 104 serve as the drain and the source of the NMOS transistor Mn1, respectively. The area between the N-type doped areas 122 and 126 is a channel area on which a gate 128 of the NMOS transistor Mn1 is formed. A pick-up doped area 130 is formed adjacent to the N-type doped area 126, serving voltage pick-up. The isolation structure 106 separates the N-type doped area 122 and the N-type doped area 114.

Referring to FIG. 6, the P-type doped area 112 (the anode of the diode Da1), the N-well 102, the P-type substrate 100, the P-well 104, the N-type doped area 126 and the P-type pick-up doped area 130 constitute a silicon-controlled rectifier (SCR). The present invention uses the way by coupling the diode and the MOS transistor in series, and the parasitic SCR, so as to achieve the protection effect of the ESD protection circuit. The parasitic SCR is triggered when an ESD pulse occurs, so as to form the ESD route.

Referring to FIGS. 5 and 6, the diode Db1 provides a cut-in voltage between the terminals TC and TA. If the noise voltage at the terminal TC is smaller than the cut-in voltage of the diode Db1, the noise cannot pass through the diode Db1 and reach the terminal TA. In contrast, if the noise voltage at the terminal TC is higher than the cut-in voltage of the diode Db1, the noise passes through the diode Db1, reaching the terminal TA.

Under normal operation, the diode Da1 also provides a cut-in voltage. The NMOS transistor Mn1 provides a resistance with from about hundreds to about thousands of ohms. The resistance of the NMOS transistor Mn1 reduces the noise level under normal operation. In other words, by controlling the gate voltage applied to the NMOS transistor Mn1, the control of the noise can be achieved. For example, by applying a high voltage to the gate, the resistance of the NMOS transistor Mn1 is equivalent to a range of about hundreds to about thousands of ohms. If a low voltage is applied to the gate, the resistance of the NMOS transistor Mn1 is equivalent to about 1 Giga ohms.

When ESD occurs, for example, at terminal TC and the terminal TA is grounded, the NMOS transistor Mn1 is turned off and the diode Db1 is under forward-bias. The ESD current flows from the terminal TC to the grounded terminal TA through the diode Db1.

Figure 7:
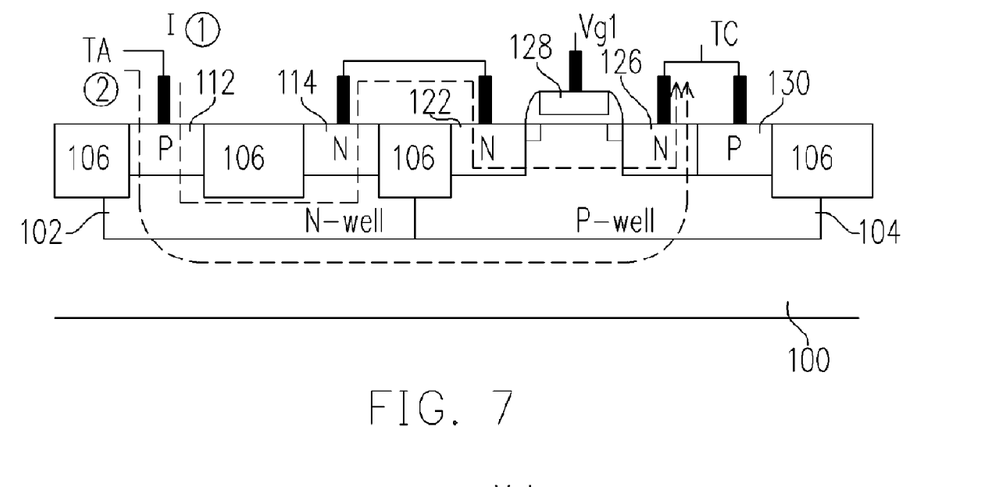
FIG. 7 is a schematic cross sectional drawing showing an ESD current discharge mechanism according to the present invention.

When ESD occurs, for example, at terminal TA and the terminal TC is grounded, the discharge mechanism can be explained by FIG. 7. FIG. 7 is a schematic cross sectional drawing showing an ESD current discharge mechanism according to the present invention. The discharge mechanism is on the basis of applying the SCR shown in FIGS. 5 and 6. Referring to FIG. 7, when ESD occurs at the terminal TA, the diode Da1 is under forward-bias, and the Vg1 turns on the NMOS transistor Mn1. An initial current flows through the diode Da1 to the NMOS transistor Mn1 along the route ①. The initial current flows into the anode of the diode Da1, i.e. the P-type doped area 112, through the N-well 102, reaching the cathode of the diode Da1, i.e. the N-type doped area 114. Then the initial current reaches the terminal TC by flowing through the N-type doped area 1114, the drain the NMOS transistor Mn1, i.e. the N-type doped area 122, and the source of the NMOS transistor Mn1, i.e. the N-type doped area 126.

The initial current triggers the parasitic SCR so that the ESD current flows to the terminal TC along the route ②. After the initial current I reaches to the terminal TC along the route ①, the parasitic SCR is triggered. The ESD current flows to the terminal TC through the P-type doped area 112, the N-well 102, the P-type substrate 100, the P-well 104 and the N-type doped area 126 (the source of the NMOS transistor Mn1) as shown in FIG. 7.

Figure 8:
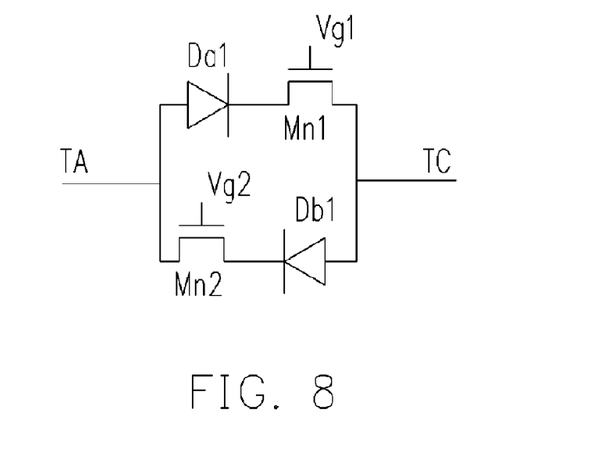
FIG. 8 is a schematic circuit showing an exemplary separated ESD protection circuit according to the present invention.

FIG. 8 is a schematic circuit showing another exemplary separated ESD protection circuit according to the present invention. Referring to FIG. 8, it is a modification of the circuit shown in FIG. 5. A structure similar to the combination of diode Da1 and the NMOS transistor Mn1 of FIG. 5 is parallel and reversely disposed between the terminals TC and TA. It means that an NMOS transistor Mn2 is disposed between the cathode of the diode Db1 and the terminal TA. Accordingly, the circuit as shown in FIG. 8 forms a symmetric structure between the terminals TA and TC. The operation of the circuit is similar to that described above. Detailed descriptions are not repeated. The circuit in FIG. 8 provides two ESD routes, either from the terminals TA to TC or from the terminals TC to TA. Either of the routes uses the parasitic SCR as an ESD route. In FIG. 5, the circuit, however, only applies the diode Da1 and the NMOS transistor Mn1, which constitute the parasitic SCR as an ESD route.

Figure 9:
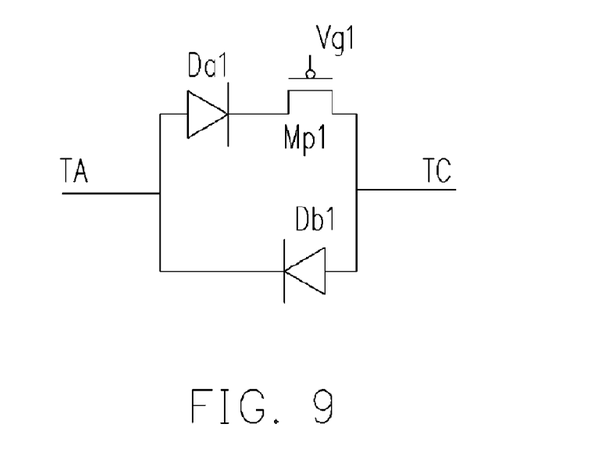
FIG. 9 is a schematic circuit showing an exemplary separated ESD protection circuit according to the present invention.

FIG. 9 is a schematic circuit showing another exemplary separated ESD protection circuit according to the present invention. In this embodiment, the circuit replaces the NMOS transistor Mn1 with the PMOS transistor Mp1. The operation of the circuit is similar to that described above. Detailed descriptions are not repeated. Compared with the circuit in FIG. 5, the circuit in FIG. 9 applies the PMOS transistor Mp1. The structure of NMOS transistor Mn1 shown in FIG. 6, which comprises the P-well 104, the N-type doped areas 122 and 126 and the P-type pick-up doped area 130, is replaced by the structure of PMOS transistor Mp1, which comprises an N-well, P-type doped areas and an N-type pick-up doped area. Accordingly, the parasitic SCR comprises the P-type doped area (the anode of the diode Da1, the N-well, the P-type substrate, the N-well (PMOS transistor) and the N-type pick-up doped area.

Figure 10:
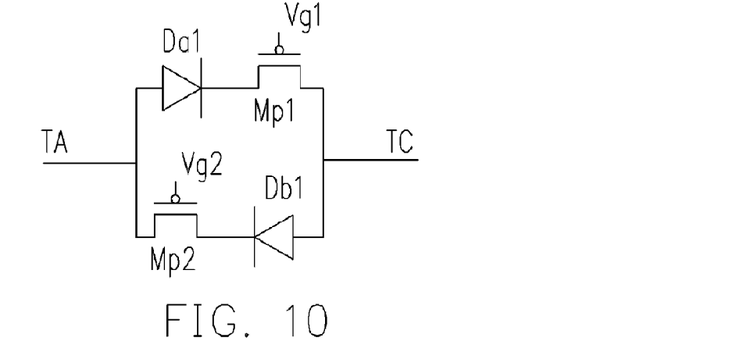
FIG. 10 is a schematic circuit showing an exemplary separated ESD protection circuit according to the present invention.

FIG. 10 is a schematic circuit showing another exemplary separated ESD protection circuit according to the present invention. The circuit of this embodiment is a modification of the circuit in FIG. 8. The NMOS transistors Mn1 and Mn2 in FIG. 8 are replaced by the transistors Mp1 and Mp2. The operation of the circuit is similar to that described above. In order to constitute the parasitic SCR providing the ESD routes between the terminals TA and TC, the dopant types in this structure thus can be modified.

Figure 11:
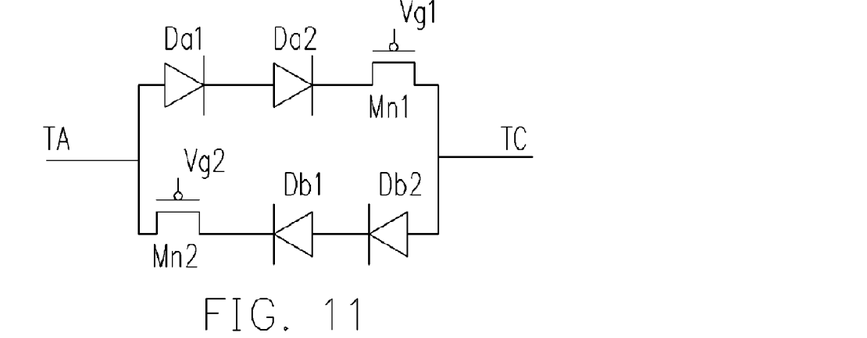
FIG. 11 is a schematic circuit showing an exemplary separated ESD protection circuit according to the present invention.
Figure 12:
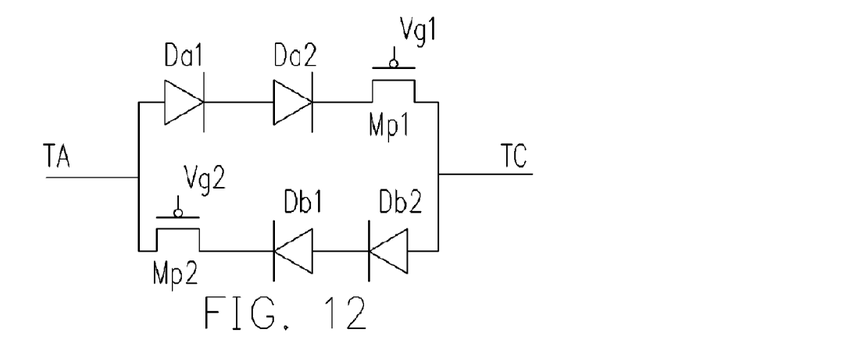
FIG. 12 is a schematic circuit showing an exemplary separated ESD protection circuit according to the present invention.
Figure 13:
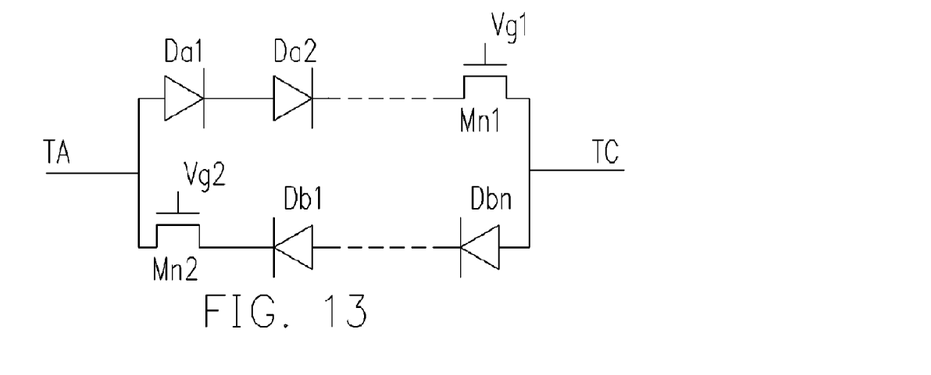
FIG. 13 is a schematic circuit showing an exemplary separated ESD protection circuit according to the present invention.

FIG. 11 is a schematic circuit showing another exemplary separated ESD protection circuit according to the present invention. In this embodiment, the circuit is a modification of the circuit in FIG. 8. In FIG. 8, each of the ESD routes comprises a diode and an NMOS transistor between the terminals TA and TC. In FIG. 11, however, each of the ESD routes comprises two diodes and an NMOS transistor. The design of the circuit of this embodiment is on the basis of the voltage difference between the terminals TA and TC. According to the voltage difference between the terminals TA and TC, and the cut-in voltage about 0.4–0.6V of every diode, the number of the diodes can be justified. That is, if the voltage difference between the terminals TA and TC is equal to about two-fold cut-in voltage of the diode, two diodes can be applied in series so as to form the circuit shown in FIG. 11. The operation of the circuit is similar to that described above. Detailed descriptions are not repeated. The circuit shown in FIG. 12 is a modification of the circuit in FIG. 11. Compared with the circuit shown in FIG. 11, the NMOS transistors Mn1 and Mn2 are replaced with the PMOS transistors Mp1 and Mp2. The operation of the circuit is similar to that described above. Detailed descriptions are not repeated. FIG. 13 is an exemplary circuit with a plurality of diodes coupled in series. The number of the diodes depends on the voltage difference between the terminals TA and TC. The NMOS transistor shown in FIG. 13 can be replaced with the PMOS transistor.

Following are some embodiments showing the application of the ESD protection circuit according to the present invention in integrated circuits. Especially, these integrated circuits have different power lines.

Figure 14:
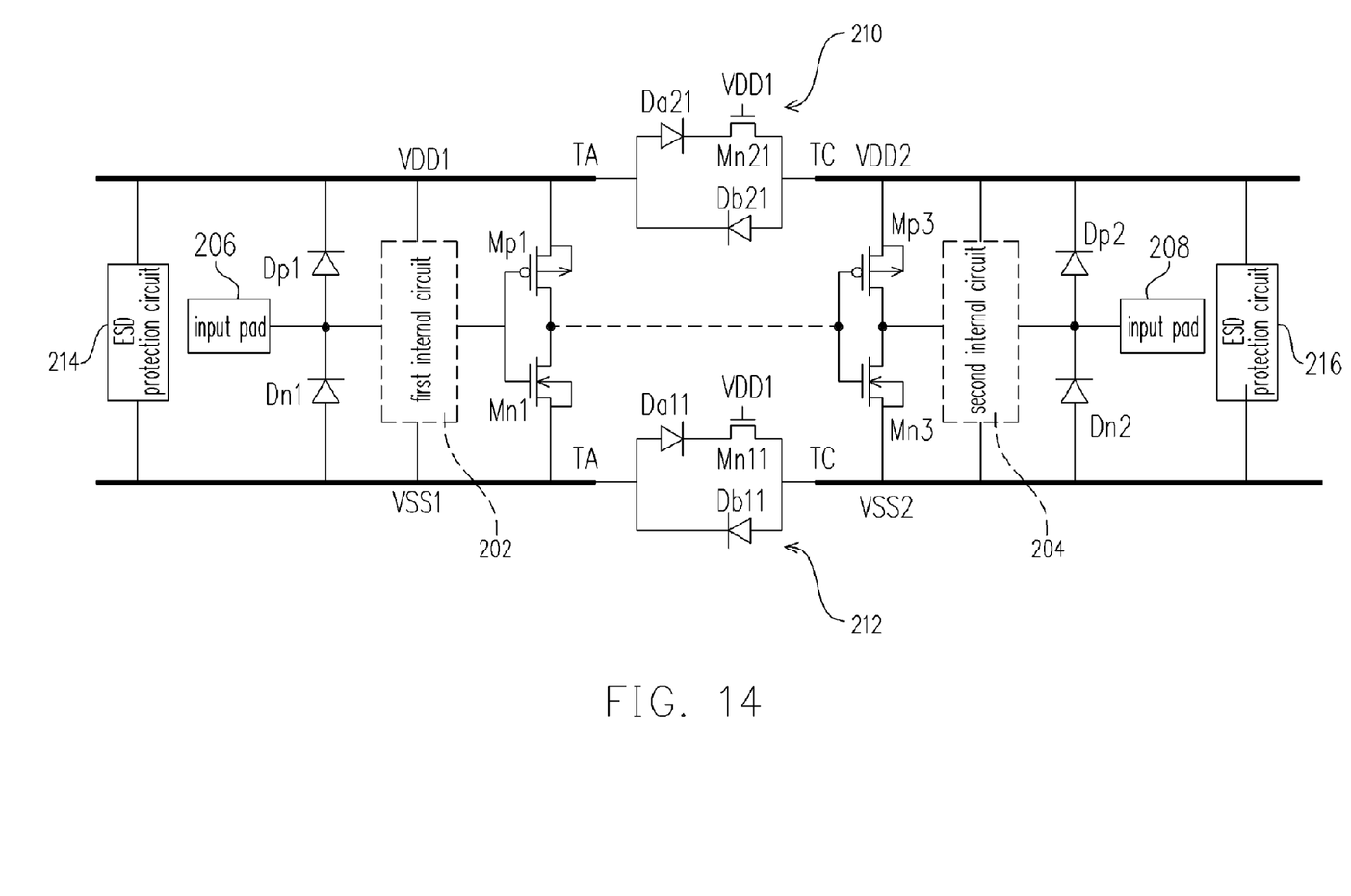
FIG. 14 is a schematic circuit showing a first exemplary application of the separated power ESD protection circuit according to the present invention.

FIG. 14 is a schematic circuit showing a first exemplary application of the separated power ESD protection circuit according to the present invention. The separated power ESD protection circuits 210 and 212 of the present invention are disposed between a first internal circuit 202 and a second internal circuit 204. The separated power ESD protection circuit 210 comprises diodes Da21 and Db21, and an NMOS transistor Mn21. The separated power ESD protection circuit 212 comprises diodes Da11 and Db11, and an NMOS transistor Mn11. Both of these circuits are similar to that shown in FIG. 5.

The first internal circuit can be, for example, a digital circuit; the second internal circuit can be, for example, an analog circuit. The first internal circuit 202 is coupled to a first high power line VDD1 and a first low power line VSS1. The first low power line VSS1 is can be, for example, a ground voltage. The first high power line VDD1 has a voltage higher than that of the first low power line VSS1. The second internal circuit 204 is coupled to a second high power line VDD2 and a second low power line VSS2. The second low power line VSS2 has a voltage lower than that of the second high power line VDD2. The separated power ESD protection circuit 210 is disposed between the first high power line VDD1, i.e. the terminal TA, and the second high power line VDD2, i.e. the terminal TC. The separated power ESD protection circuit 212 is disposed between the first low power line VSS1, i.e. the terminal TA, and the second low power line VSS2, i.e. the terminal TC.

An input pad 206 is coupled to the first internal circuit 202, the anode of the diode Dp1 and the cathode of the diode Dn1. The input pad 206 is then coupled to the first high power line VDD1 via the diode Dp1 and to the first low power line VSS1 via the diode Dn1. An input pad 208 is coupled to the second internal circuit 204, the anode of the diode Dp2 and the cathode of the diode Dn2. The input pad 208 is then coupled to the second high power line VDD2 via the diode Dp2 and to the second low power line VSS2 via the diode Dn2. The inverter composed of the PMOS transistor Mp1 and the NMOS transistor Mn1 is coupled between the terminals TA, i.e. the first high power line VDD1 and the first low power line VSS1, of the separated power ESD protection circuits 210 and 212, and the first internal circuit 202. The inverter composed of the PMOS transistor Mp2 and the NMOS transistor Mn2 is disposed between the terminal TC, i.e. the second high power line VDD2 and the second low power line VSS2, of the separated power ESD protection circuits 210 and 212 and the second internal circuit 204.

An ESD protection circuit 214 is disposed between the first high power line VDD1 of the internal circuit 202 and the first low power line VSS1. Another ESD protection circuit 216 is disposed between the second high power line VDD2 of the internal circuit 204 and the second low power line VSS2. The ESD protection circuits 214 and 216 provide routes for the first internal circuit 202 and the second internal circuit 204 between the high power supply and the low power line, from the VDD1 to the VSS1 and VDD2 to the VSS2.

In general, the voltage applied to the gate of the NMOS transistor Mn1 can be controlled to have the different level of isolation capability. For example, when a high voltage is applied to the gate of the NMOS transistor Mn1, an equivalent resistance between the drain and the source of the NMOS transistor Mn1 can be about from hundreds to thousands of ohms. When a low voltage is applied to the gate of the NMOS transistor Mn1, the NMOS transistor Mn1 is turned off. The circuit between the drain and the source is equivalent to be open. Under a normal operation, a noise at the power line VDD1 or VDD2 can be higher than a critical voltage so as to couple the power lines VDD1 and VDD2, or the noise is separated and the connection between the VDD1 and VDD2 is open. Under a high-noise operation, the number of diodes can be increased. The normal operation of the power line VSS1 and VSS2 is similar to that described above. Detailed descriptions are not repeated.

Under a normal operation, the diode Db21 of the separated power ESD protection circuit 210 provides a cut-in voltage between the second high power line VDD2, i.e. the terminal TC, and the first high power line VDD1, i.e. the terminal TA. When the voltage of the noise at the second high power line VDD2 is smaller compared to the cut-in voltage of the diode Db21, the noise cannot reach the first high power line VDD1 via the diode Db21. When the voltage of the noise at the second high power line VDD2 is higher than the cut-in voltage of the diode Db21, the noise flows through the diode Db21 to the first high power line VDD1. Under the normal operation, the diode Da21 also provides another cut-in voltage. The NMOS transistor Mn21 provides a resistance from about hundreds to thousands of ohms on the route between the first high power line VDD1 and the second high power line VDD2. Under the normal operation, the forgoing resistance of the NMOS transistor Mn21 can reduce the noise level flowing through it.

Under a normal operation, the diode Db11 of the separated power ESD protection circuit 212 provides a cut-in voltage between the second low power line VSS2, i.e. the terminal TC, and the first low power line VSS1, i.e. the terminal TA. When the voltage of the noise at the second low power line VSS2 is smaller, compared to the cut-in voltage of the diode Db11, the noise cannot reach to the first low power line VSS1 via the diode Db11. When the voltage of the noise at the second low power line VSS2 is higher than the cut-in voltage of the diode Db11, the noise flows through the diode Db11 to the first low power line VSS1. Under the normal operation, the diode Da11 also provides another cut-in voltage. The NMOS transistor Mn11 provides a resistance from about hundreds to thousands of ohms on the route between the first low power line VSS1 and the second low power line VSS2. Under the normal operation, the resistance of the NMOS transistor Mn11 can reduce the noise level flowing through it.

Following are the descriptions of the operation of the ESD protection. When a positive static voltage is applied to the input pad 206 and the second low power line VSS2 is grounded, the static voltage applied to the input pad 206 turns on the diode Dp1. The ESD current flows from the first high power line VDD1 to the first low power line VSS1 via the ESD protection circuit 214. Then the ESD current flows to the second low power line VSS2 via the separated power ESD protection circuit 212. While the static voltage is coupled to the first low power line VSS1, the diode Da11 of the separated power ESD protection circuit 212 is forward-bias and the NMOS transistor Mn11 is turned on. The parasitic SCR composed of the diode Da11 and the NMOS transistor Mn11 is then triggered. The ESD current flows from the first low power line VSS1 to the second low power line VSS2 along the route provided by the parasitic SCR. The mechanism of the discharge can be referred to FIG. 7. The static voltage applied to the input pad 206 makes the diode Dp1 forward-biased. The static voltage is then coupled to the first high power line VDD1. The diode Da11 of the separated power ESD protection circuit 210 is forward-bias, and the NMOS transistor Mn11 is turned on. The parasitic SCR composed of the diode Da21 and the NMOS transistor Mn21 is triggered. The ESD current then flows from the first high power line VDD1 to the second high power line VDD2 along the route provided by the parasitic SCR. Then, the ESD current flows to the second low power line VSS2 along the ESD protection circuit 216. When a negative ESD voltage is applied to the input pad 206, the ESD current flows along a route, which is reverse to that described above.

In addition, when a positive static voltage is applied to the input pad 208 and the first low power line VSS1 is grounded, the static voltage applied to the input pad 208 turns on the diode Dp2. The ESD current flows from the second high power line VDD2 to the second low power line VSS2 via the ESD protection circuit 216. Then the ESD current flows to the first low power line VSS1 via the separated power ESD protection circuit 212. While the static voltage is coupled to the second low power line VSS2, the diode Db11 of the separated power ESD protection circuit 212 is forward-bias and turned on. The ESD current flows from the second low power line VSS2 to the first low power line VSS1. While the ESD voltage is coupled to the second high power line VDD2 via the diode Dp2, the diode Db21 of the separated power ESD protection circuit is forward-bias and turned on. The ESD current flows from the second high power line VDD2 to the first high power line VDD1. Then, the ESD current flows to the first low power line VSS1 via the ESD protection circuit. When a negative ESD voltage is applied to the input pad 208, the ESD current flows along a route, which is reverse to that described above.

Figure 15:
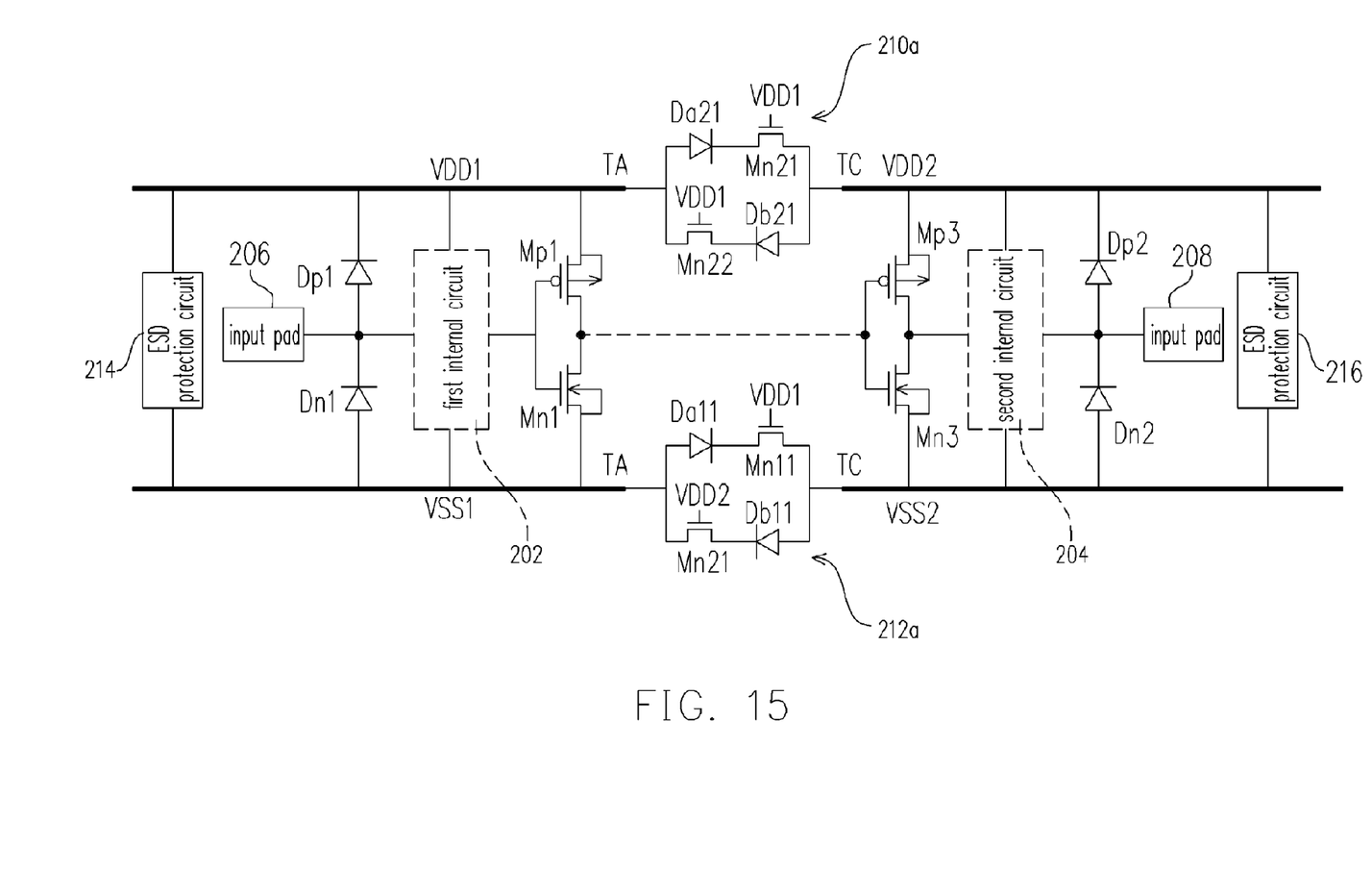
FIG. 15 is a schematic circuit showing a second exemplary application of the separated power ESD protection circuit according to the present invention.

FIG. 15 is a schematic circuit showing a second exemplary application of the separated power ESD protection circuit according to the present invention. Comparing with the circuit in FIG. 14, additional NMOS transistors Mn21 and Mn22 are disposed between the terminals TA and the diodes Db21 and Db22, respectively, as shown in FIG. 15. The discharges either from the terminal TA to the terminal TC or from the terminal TC to the terminal TA are similar to those in FIG. 14. In other words, the discharge routes between the high power lines VDD1 and VDD2, and the low power line VSS1 and VSS2 are composed of the diodes and the transistors. Operations of the circuit in FIG. 15 are similar to those described in FIG. 14. Detailed descriptions are not repeated.

Figure 16:
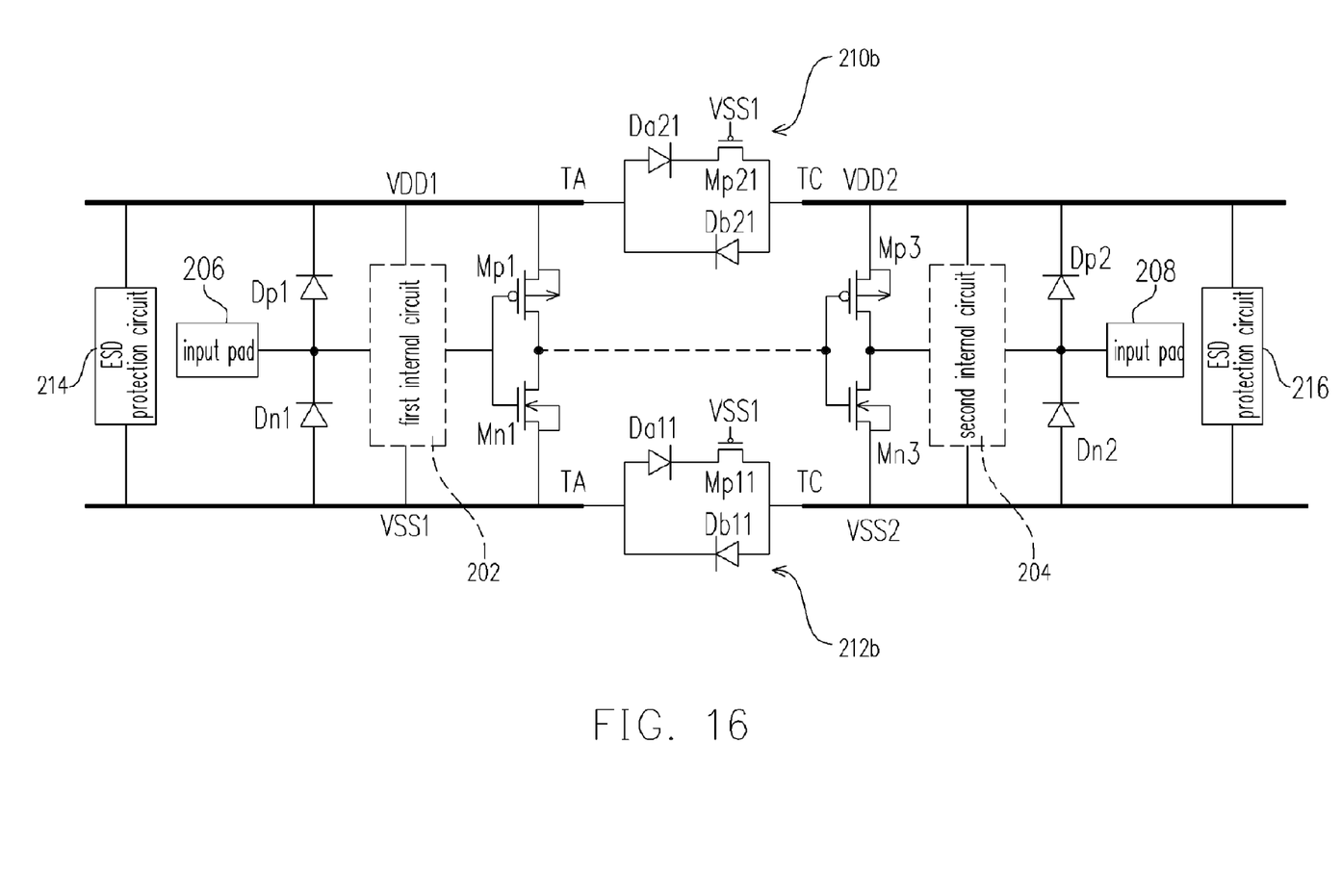
FIG. 16 is a schematic circuit showing a third exemplary application of the separated power ESD protection circuit according to the present invention.

FIG. 16 is a schematic circuit showing a third exemplary application of the separated power ESD protection circuit according to the present invention. Compared with the circuit in FIG. 14, the NMOS transistors Mn11 and Mn21 of the separated power ESD protection circuits 210 and 212 are replaced by the PMOS transistors Mp11 and Mp21, respectively. Operations of the circuit in FIG. 16 are similar to those described in FIG. 14. The descriptions of the operations can also be referred to FIG. 9. Detailed descriptions are not repeated.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An integrated circuit adapted to protect a first and a second internal circuits from electro-static discharge (ESD), the first internal circuit coupled between a first high power line and a first low power line, the second internal circuit coupled between a second high power line and a second low power line, the first and the second high power lines being separated from each other, the first and the second low power lines being separated from each other, the integrated circuit comprising:

a first ESD protection circuit, coupled between the first high and the first low power lines;

a second ESD protection circuit, coupled between the second high and the second low power lines;

a third ESD protection circuit, coupled between the first high and the second high power lines, selectively grounding the first or the second high power lines while ESD occurring on the first or the second high power lines, wherein the third ESD protection circuit comprises a first diode string, a first metal-oxide-semiconductor (MOS) transistor and a second diode string, wherein the first diode string and the first MOS transistor are coupled in series; the second diode string are parallel and reverse to the first diode string and the first MOS transistor, and the first diode string and the first MOS transistor constitute a parasitic silicon-controlled rectifier (SCR) for providing a discharge route while triggered by ESD; and a fourth ESD protection circuit, coupled between the first low and the second low power lines, selectively grounding the first or the second low power lines while ESD occurring on the first or the second low power lines, wherein the fourth ESD protection circuit comprises third diode string, a second metal-oxide-semiconductor (MOS) transistor and fourth diode string, the third diode string and the second MOS transistor are coupled in series; the fourth diode string are parallel reverse to the third diode string and the second MOS transistor; and the third diode string and the second MOS transistor constitute a parasitic silicon-controlled rectifier (SCR) for providing a discharge route while triggered by ESD.

2. The integrated circuit of claim 1, wherein the first and second MOS transistors comprise an N-type or a P-type MOS transistor.

3. The integrated circuit of claim 1, wherein first series and second diode string of the third ESD protection circuit comprise at least one diode, and the third series and fourth diode string of the fourth ESD protection circuit comprise at least one diode.

4. The integrated circuit of claim 3, wherein numbers of the first series and second diode string depend on a voltage difference between the first high power line and the second high power supply bus.

5. The integrated circuit of claim 3, wherein numbers of the third series and fourth diode string depend on a voltage difference between the first low power line and the second low power supply bus.

6. The integrated circuit of claim 1, wherein the third ESD protection circuit further comprises a third MOS transistor, which is coupled to the second diode string in series; the first and third MOS transistors are coupled to the second high and the first high power lines, respectively; tile fourth ESD protection circuit further comprises a fourth MOS transistor, which is coupled to the fourth diode string in series; and the second and the fourth MOS transistors are coupled to the second and the first low power lines, respectively.

7. The integrated circuit of claim 6, wherein the first, second, third and fourth MOS transistors comprise an N-type or a P-type MOS transistor.

8. The integrated circuit of claim 4, further comprising:

a first input ESD protection circuit, coupled and among the first internal circuit, an input pad of the first internal circuit, the first high power line and the first low power line; and a second input ESD protection circuit, coupled and among the second internal circuit, an input pad of the second internal circuit, the second high power line and the second low power line.

* * * * *